AUTOMATIC GAIN CONTROL FOR TRANSISTOR AMPLIFIERS

Filed Jan. 23, 1959 2 Sheets-Sheet 1

Inventor:
Joseph A. Worcester,
by Lawrence R. Kempton
His Attorney.

Inventor:
Joseph A. Worcester,
by Laurence R. Kempton
His Attorney.

3,007,047
Patented Oct. 31, 1961

3,007,047

AUTOMATIC GAIN CONTROL FOR TRANSISTOR AMPLIFIERS

Joseph A. Worcester, Utica, N.Y., assignor to General Electric Company, a corporation of New York Filed Jan. 23, 1959, Ser. No. 788,637
8 Claims. (Cl. 250—20)

Figure 1:
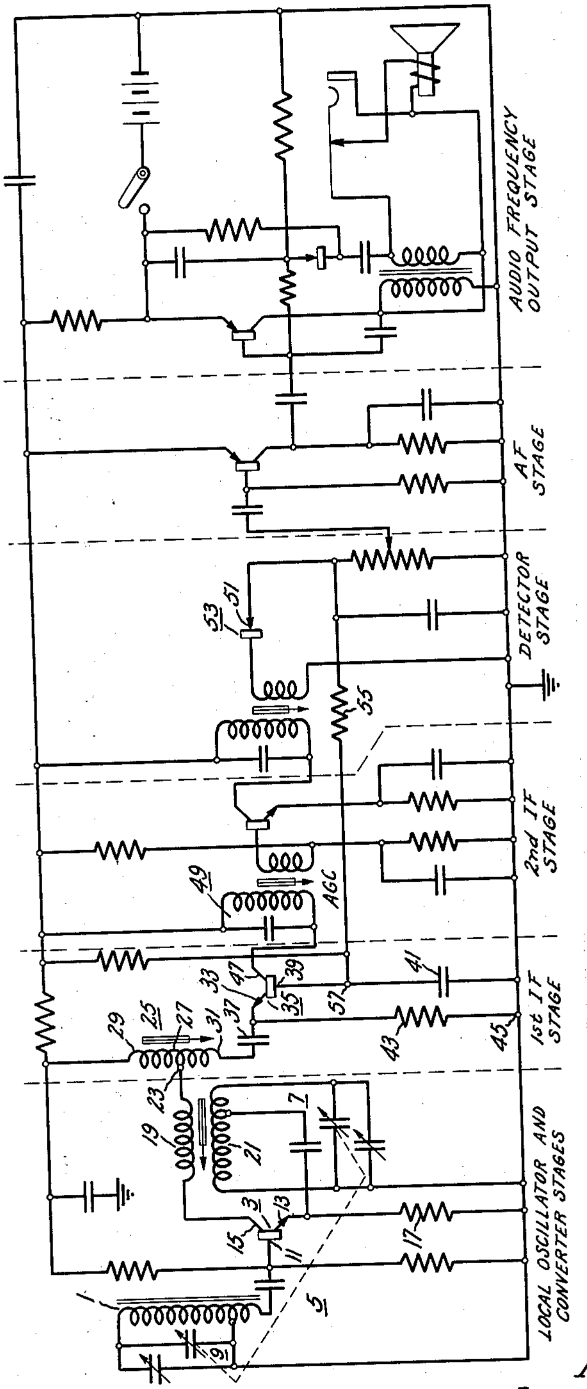

This invention relates to improvements in automatic gain control for signal amplifying circuits of radio signal receiving systems and the like, and in particular to means for automatically controlling the gain in signal amplifying circuits of the type employing semiconductor devices such as transistors for signal amplification.

It has been long recognized as beneficial to provide an automatic gain control (AGC) system in a signal receiver to automatically vary the total amplification of the signal with changing strength of the received signal. Such a system must maintain the power output of the receiver substantially constant for large variations of signal strengths in situations where "fading" due to atmospheric variations occurs. The AGC system must also be capable of limiting the signal strength of strong signals to prevent overloading in circuits preceding the manual volume control so as to prevent distortion. Where transistor amplifiers are used in a signal receiver, heretofore two basic types of AGC circuits have been utilized. One of these circuit types is the conventional primary AGC circuit wherein AGC voltage is developed at the diode detector and fed back to the base of a first intermediate frequency common emitter stage. The stage gain is a function of the emitter current, and as the base bias voltage is lowered, the emitter current drops, thereby lowering the gain of the stage. Use of this primary AGC circuit alone has indicated an inability of the transistor to effectively limit the gain of the signal, thus providing poor AGC action. To remedy this shortcoming of the primary AGC circuit a second type of circuit has been utilized. This circuit adds delayed AGC action to the primary AGC circuit, giving very good AGC action, and minimizing overload distortion on strong signal inputs. Such a circuit is often referred to as a primary plus delayed AGC circuit, and it requires an overload diode and an additional resistor, which are connected so as to produce variable loading on the intermediate frequency tuned circuit in the output of the converter. The use of the overload diode and the additional resistor entails a significant additional cost in the form of manufacturing and material expenses. This increased cost is conveniently eliminated by the using of the circuit of the present invention, and no loss in AGC efficiency is caused thereby. With this invention the full benefits of the primary plus delayed type AGC are thus effectively realized, without the necessity of using an extra diode or an additional resistor.

The general object of this invention is to provide an improved automatic gain control which both compensates for "fading" and prevents distortion due to strong input signals.

It is another object of the present invention to provide an improved automatic gain control which compensates for "fading" and prevents distortion due to strong input signals, while obviating the necessity of any additional components.

It is another and more specific object of the present invention to provide an improved automatic gain control for a transistor amplifier circuit by means of which the gain of a transistor, and the load impedance of a tuned circuit driving this transistor, may be simultaneously controlled in response to the strength of a signal carrier wave.

It is a further object of the present invention to provide an improved automatic gain control circuit for a transistorized radio receiver, which substantially eliminates overload distortion on strong input signals, and which represents a significant reduction in cost.

In carrying out my invention, in one form thereof, the automatic gain and tuned circuit loading control comprises a junction type transistor amplifier in the grounded base configuration, a tuned circuit connected in series with the emitter-base junction of the transistor, and an AGC biasing voltage applied to the base of the transistor to simultaneously control the amplifier gain and the load impedance of the tuned circuit in response to signal input strength.

The novel features that are considered characteristic of this invention are set forth with particularity in the appended claims. The invention itself, however, both as to its organization and method of operation, as well as additional objects and advantages thereof, will best be understood from the following description when read in conjunction with the accompanying drawings.

Figure 2:
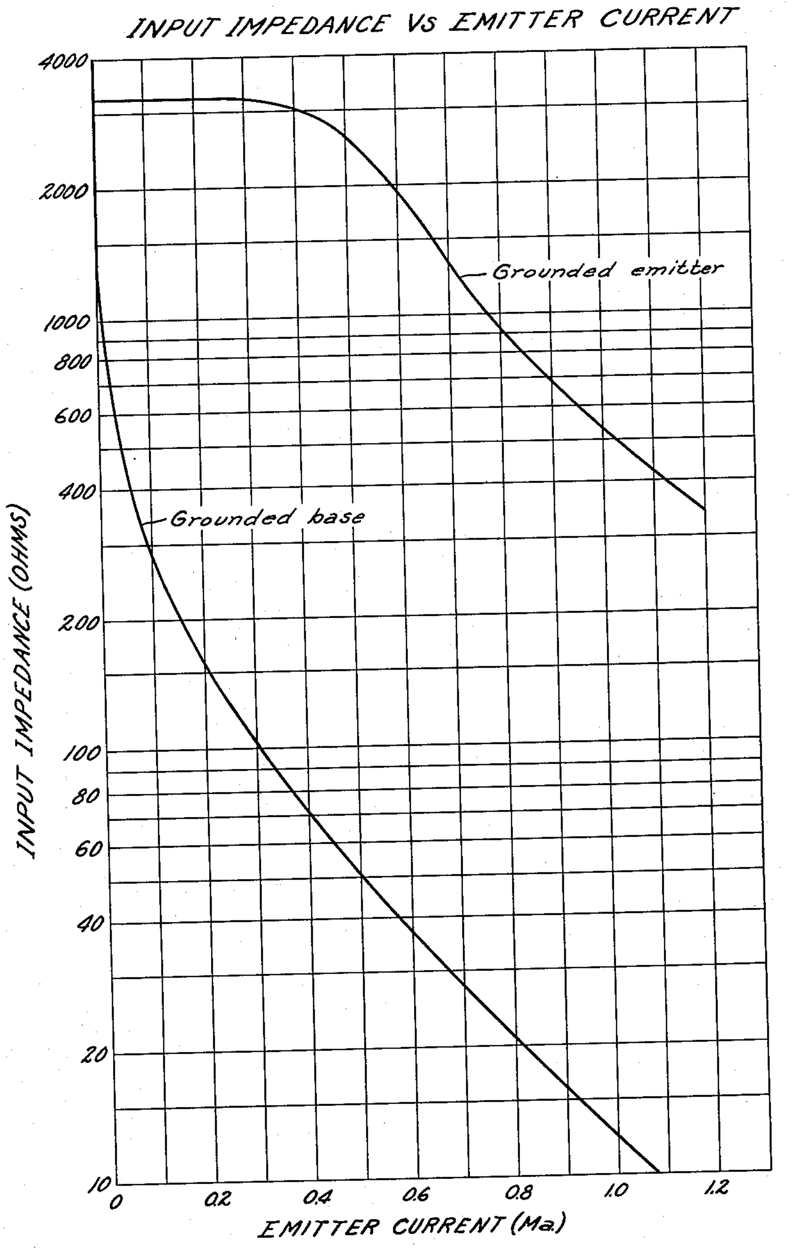

FIG. 1 is a schematic circuit diagram of a transistorized radio signal receiver embodying the present invention; and FIG. 2 represents a plot of input impedance vs. emitter current for a transistor when connected in the grounded base and grounded emitter configurations.

Referring now to FIG. 1 of the drawing, there is shown a transistorized superheterodyne receiver comprising local oscillator and converter, first intermediate frequency, second intermediate frequency, detector, audio frequency, and audio frequency output stages, as indicated between dotted lines of the schematic circuit diagram in FIG. 1.

A signal is received by antenna 1 which may be of the ferrite rod type. This signal is then applied to the converter or mixer stage which includes converter transistor 3 and its associated circuitry. A ganged tuning condenser 5 is utilized to tune the resonant L-C oscillator circuit 7 in the emitter circuit of transistor 3 as well as the radio frequency L-C circuit 9 which is connected to the base 11 of transistor 3. The converter transistor 3 may be of the N-P-N type as shown in the drawing and includes grounded emitter 13 and collector 15, with the emitter 13 connected to ground through resistor 17.

The output of the converter stage is taken from the collector 15 through inductor 19, which is inductively coupled to autotransformer 21 of the emitter oscillator circuit 7, and tapped at point 23 to intermediate frequency matching autotransformer 25. The coil 27 of autotransformer 25 has one side 29 connected to electrical ground with respect to radio frequencies. The other side 31 of the autotransformer coil 27 is connected through capacitor 37 in series with the emitter electrode 33 of first intermediate frequency transistor 35 to provide the input to the first intermediate frequency stage from the converter stage of the receiver.

Transistor 35 is preferably of the alloy junction type, and has its base or control portion 39 connected to ground through electrolytic capacitor 41. The grounded base configuration has been found most desirable for the transistor in the first intermediate frequency stage because it provides a greater variation of input impedance vs. emitter current than the variation of such a curve for a transistor in the grounded emitter configuration. This is clearly shown by FIG. 2, which represents plots of input impedance vs. emitter current, for the grounded base and grounded emitter configurations of an alloy junction transistor. The conventional N-P-N junction transistor, such as the transistor 35 shown in FIG. 1, includes a body of semiconductive material having a pair of outer zones of the negative conductivity type disposed on opposite sides of an intermediate zone of the positive conductivity type. One of the outer zones of the transistor has a forward bias and thus serves as the emitter thereof. The other outer zone has a reverse bias, and serves as the collector electrode of the transistor. The negatively or forward biased N-type emitter injects electrons which diffuse through the narrow P region and are collected by the positively or reverse biased collector. In the junction type of transistor the current in the collector circuit is controlled by the emitter circuit.

A resistor 43 is connected from a point intermediate to capacitor 37 and emitter electrode 33, to ground through point 45. The combination of coil 27 and capacitor 37 provides a tuned circuit in the output of converter transistor 3, the emitter-to-base resistance of the transistor 35 being in series with this tuned circuit. At the same time, the circuit arrangement functions to apply a signal from the tuned circuit 25—37 to the emitter 33 of the transistor 35. The output of transistor 35 is fed from the collector 47 to the primary of matching transformer 49 to provide the input for the second intermediate frequency stage of the receiver.

Since the remaining stages illustrated in FIG. 1 are shown only to facilitate understanding of the complete transistorized receiver in which the subject invention is utilized, with the exception of the detector stage which furnishes the AGC source, these remaining stages will not be discussed.

In order to secure satisfactory operation of a radio receiver it is desirable to maintain a constant audio output under "fading" conditions and to minimize overloading due to strong input signals. To achieve such operation, in accordance with my invention, a source of automatic gain control potential is obtained from the plate 51 of detector diode 53 of the detector stage, and this potential is applied via resistor 55 to the base 39 of the transistor 35 by means of a connection at point 57. Since the first intermediate frequency transistor 35 is connected in the grounded base configuration, the input impedance varies smoothly and inversely as a function of the emitter current. This is shown by the curve in FIG. 2. Such a smooth relationship between input impedance and emitter current variations, is a peculiar characteristic of a transistor having a grounded base circuit, and this characteristic is extremely pertinent to this invention. The input impedance of a grounded base transistor such as transistor 35 consists of two parts. One of these parts is the resistance of the forward biased emitter-base junction, which varies inversely with emitter current. The other part of the input impedance is the "parasitic" base resistance which exists between the base lead and the internal or effective base. This base resistance is determined by the resistivity of the base material and the geometrical configuration of the base region of the transistor. With transistor 35 connected in the grounded base configuration, the base resistance is common to both the collector output and emitter input circuits of the first intermediate frequency stage. This common base resistance causes an effective negative resistance to occur in the emitter input circuit of the transistor, which improves the gain of the circuit.

As automatic gain control potential is applied to the base of first intermediate frequency transistor 35 from plate 51 of detector diode 53, the emitter current in transistor 35 is decreased. This decrease in the emitter current causes the gain of transistor 35 to decrease, thereby providing the conventional AGC effect. With transistor 35 connected in the grounded base configuration, as shown in FIG. 1, the decrease in the emitter current also causes the resistance of the forward biased emitter-base junction to increase, as has been previously explained, and this increases the resistivity of the input impedance of transistor 35. Q is a parameter or figure of merit which is often used to indicate the selectivity of a tuned circuit, and its value for the tuned driving circuit of transistor 35 may be defined as $$Q=\frac{\text{inductive reactance of tuned circuit at resonant frequency}}{\text{resistance of tuned circuit}}$$

As the resistivity of the input impedance of transistor 35 is increased, a decreased load impedance is reflected to collector 15 of the converter stage, and the Q of the tuned circuit decreases. This decreased load impedance which is thus reflected to the output of converter transistor 3, causes a decrease in power transfer from the converter stage to the first intermediate frequency stage, because a decreased signal voltage will be developed across the decreased value of load impedance. An additional or supplementary AGC action is thus provided, which prevents convertor collector overload from occurring at high signal input levels, without the requirement of any additional components such as an overload diode and an additional resistor.

At their present states of development, alloy junction transistors have been found to have lower values of base resistance and hence, provide more AGC control than the rate grown type of transistors and are therefore preferable in carrying out my invention. Although an N-P-N type of transistor is shown in the drawing, the P-N-P type can be used in the alternative if suitable polarity of operating voltage is provided.

The disclosed AGC circuit provides a simple and expeditious automatic gain control from a single grounded base stage of a signal receiver, while obviating the necessity of utilizing the additional components required by prior art devices, to accomplish the same objectives. A means for providing very good AGC control for a signal receiver at significantly reduced cost has thus been provided for by virtue of this invention.

While I have herein shown and described a typical embodiment of my invention, it will be understood that the invention is not limited to the precise details described or to the exact operation set forth.

What I claim as new and desire to secure by Letters Patent of the United States is:

1. An automatic gain control circuit for a transistor amplifier, comprising a body of semiconductive material having a pair of outer zones of one conductivity type disclosed on opposite sides of an intermediate zone of the other conductivity type, one of said outer zones having a forward bias and the other outer zone having a reverse bias, a series-resonant tuned driving circuit connected in series with the outer zone having a forward bias, an output circuit connected in series with the outer zone having the reverse bias, said intermediate zone being connected to ground for alternating signals, means for providing an alternating signal to said tuned driving circuit, said tuned driving circuit being tuned to have series resonance at the frequency of said alternating signal, and an automatic control means connected to apply a varying control voltage to the intermediate zone, said control means simultaneously varying the amplifier gain and the impedance of the tuned driving circuit.

2. An automatic gain control circuit for a transistor amplifier, comprising a junction transistor having an emitter, a collector, and a base intermediate to said emitter and collector, a series-resonant tuned driving circuit connected in series with said emitter, an output circuit connected to said collector, a capacitor connecting said base to electrical ground, means for providing an alternating signal to said tuned driving circuit, said tuned driving circuit being tuned to have series resonance at the frequency of said alternating signal, and an automatic gain control means connected to apply a varying control voltage to said base to provide simultaneous reduction in the gain of said transistor amplifier and increase in the series impedance of the tuned circuit.

3. A receiver circuit including the combination of claim 2, wherein said transistor amplifier is located in the first intermediate frequency stage of a receiver circuit.

4. An automatic gain control circuit for a transistorized receiver circuit comprising a converter transistor, a series-resonant tuned driving circuit connected to the output of said converter transistor, a junction transistor in the first intermediate frequency stage of the receiver, said transistor including an emitter, a collector, and a base, said series-resonant tuned circuit being connected in series with the emitter of said first intermediate frequency transistor, said base of the first intermediate frequency transistor being connected to ground for alternating signals, means for supplying an alternating signal to said tuned circuit, said tuned circuit being tuned to have series resonance at the frequency of said alternating signal, and an automatic gain control means connected to apply a varying control voltage to the base of the first intermediate frequency transistor to simultaneously vary the amplifier gain and the load impedance of the tuned circuit.

5. An automatic gain control circuit comprising an alloy junction transistor amplifier including an emitter, a base, and a collector, said base being connected to ground for alternating signals, a series resonant tuned circuit supplying an alternating signal to said amplifier, said tuned circuit being connected to said emitter and in series with the emitter-base junction whereby the resistance of said junction is reflected in the impedance of said tuned circuit, said tuned circuit being tuned to have series resonance at the frequency of said alternating signal, and automatic gain control means connected to apply a varying control voltage to said base, said means effecting variation in the emitter current, the variation in the emitter current causing a change in the emitter-base junction resistance, whereby said automatic gain control means controls both the gain of said amplifier and the load impedance of said tuned circuit.

6. An automatic gain control circuit for a transistorized receiver comprising a first transistor in the converter stage of said receiver, a second transistor in the first intermediate frequency stage of said receiver, said second transistor including an emitter, a base, and a collector, said base being connected to ground for alternating signals, a series-resonant tuned circuit supplying an alternating signal to said second transistor from said first transistor, said tuned circuit being connected to said emitter and in series with the emitter-base junction whereby the resistance of said junction is reflected in the impedance of said tuned circuit, said tuned circuit being tuned to have series resonance at the frequency of said alternating signal, and automatic gain control means connected to apply a varying control voltage to said base, said means effecting a variation in the emitter current of said second transistor to provide a first automatic gain control action, this variation in the emitter current also causing a change in the emitter-base junction resistance, the change in the emitter-base junction resistance serving to reflect a lower load to the first transistor to diminish power transfer to the second transistor and thereby provide a second automatic gain control action.

7. An automatic gain control circuit comprising a transistor having base, emitter and collector electrodes, an inductor and a capacitor connected together in series to form a series-resonant combination, means connecting an end of said series-resonant combination to said emitter electrode, a source of alternating signals, means connected to apply said alternating signals to said series-resonant combination, said series-resonant combination being tuned to have series resonance at the frequency of said alternating signals, signal-conductive means connected between said base electrode and the remaining end of said series-resonant combination, said signal-conductive means being conductive for said alternating signals, a signal output circuit connected to said collector electrode, means connected to derive an automatic gain control voltage in accordance with the amplitude of said alternating signals, and means connected to apply said automatic gain control voltage to said base electrode.

8. An automatic gain control circuit comprising a transistor having base, emitter and collector electrodes, an inductor and a capacitor connected together in series to form a series-resonant combination, means connecting the capacitor end of said series-resonant combination to said emitter electrode, a source of alternating signals, means connected to apply said alternating signals to said series-resonant combination, said series-resonant combination being tuned to have series resonance at the frequency of said alternating signals; capacitive means connected between said base electrode and the inductor end of said series-resonant combination, said capacitive means having a sufficiently large value of capacitance to serve as a coupling capacitance for said alternating signals, a signal output circuit connected to said collector electrode, means connected to derive an automatic gain control voltage in accordance with the amplitude of said alternating signals, and means connected to apply said automatic gain control voltage to said base electrode.

References Cited in the file of this patent

UNITED STATES PATENTS

| | | |
|---|---|---|
| 2,750,452 | Goodrich | June 12, 1956 |
| 2,841,702 | Barton | July 1, 1958 |
| 2,866,892 | Barton | Dec. 30, 1958 |
| 2,890,293 | Overbeek | June 9, 1959 |
| 2,892,931 | Koch | June 30, 1959 |

FOREIGN PATENTS

| | | |
|---|---|---|
| 206,405 | Australia | Feb. 20, 1957 |

UNITED STATES PATENT OFFICE

CERTIFICATE OF CORRECTION

Patent No. 3,007,047 October 31, 1961

Joseph A. Worcester

It is hereby certified that error appears in the above numbered patent requiring correction and that the said Letters Patent should read as corrected below.

Column 4, lines 45 and 46, for "disclosed" read -- disposed --; line 57, before "control" insert -- gain --.

Signed and sealed this 3rd day of April 1962.

(SEAL)
Attest:

ERNEST W. SWIDER
Attesting Officer

DAVID L. LADD
Commissioner of Pat